United States Patent [19]

Widmann

[11] 4,313,256

[45] Feb. 2, 1982

[54] METHOD OF PRODUCING INTEGRATED MOS CIRCUITS VIA SILICON GATE TECHNOLOGY

[75] Inventor: Dietrich Widmann, Unterhaching, Fed. Rep. of Germany

[73] Assignee: Siemens Aktiengesellschaft, Berlin & Munich, Fed. Rep. of Germany

[21] Appl. No.: 109,808

[22] Filed: Jan. 7, 1980

[30] Foreign Application Priority Data

Jan. 24, 1979 [DE] Fed. Rep. of Germany ....... 2902665

[51] Int. Cl.³ .................... H01L 21/31; H01L 21/441
[52] U.S. Cl. ......................................... 29/579; 29/571; 29/578; 148/174; 148/187; 156/653; 156/657; 156/662; 204/15; 205/325; 357/23; 357/59
[58] Field of Search .......................... 29/571, 578, 579; 148/187, 174; 357/23, 59; 156/653, 657, 662; 204/15, 325

[56] References Cited

U.S. PATENT DOCUMENTS

| | | | |
|---|---|---|---|
| 3,634,203 | 1/1972 | McMahon et al. | 204/15 |
| 3,869,786 | 3/1975 | Adam et al. | 29/571 |
| 3,899,373 | 8/1975 | Antipov | 148/187 |
| 3,906,620 | 9/1975 | Anzai et al. | 29/571 |
| 3,986,903 | 10/1976 | Watrous | 148/187 |
| 4,035,198 | 7/1977 | Dennard et al. | 148/1.5 |
| 4,095,251 | 6/1978 | Dennard et al. | 357/59 X |
| 4,127,931 | 12/1978 | Shiba | 29/578 X |
| 4,177,096 | 12/1979 | Okumura et al. | 29/571 X |
| 4,182,636 | 1/1980 | Dennard et al. | 29/571 X |
| 4,187,602 | 2/1980 | McElroy | 357/59 X |

FOREIGN PATENT DOCUMENTS 2509315 9/1975 Fed. Rep. of Germany .
2723374 1/1978 Fed. Rep. of Germany .

OTHER PUBLICATIONS

Rideout et al., "One-Device Memory Cell . . . Metal-to-Polysilicon Contact", Int. Electron Dev. Mtg., Tech. Digest, Wash. D.C., Dec. 1977, pp. 258-261.
Oldham et al., "Improved Integrated Circuit Contact Geometry using Local Oxidation", Proc. Electro Chem. Soc., Spring Mtg, Seattle, Wash., May 1978, pp. 690-691.

Primary Examiner—L. Dewayne Rutledge
Assistant Examiner—W. G. Saba
Attorney, Agent, or Firm—Hill, Van Santen, Steadman, Chiara & Simpson

[57] ABSTRACT

A method of producing integrated MOS circuits via silicon gate technology with self-adjusting contacts by using silicon nitride masking. In accordance with this method, after etching contact holes for the formation of contacts between monocrystalline doped regions (5) and polysilicon regions (4, 8), or metal interconnections (12), an insulating layer 10 is produced. This insulating layer is produced, after appropriate masking with an oxidation-inhibiting silicon nitride layer of the regions to be connected, from a layer (8) which is additionally applied and doped to correspond to the doped regions in the silicon substrate, and which is converted by local oxidation into the insulating layer (10). This process provides extremely high packing density of circuit elements.

4 Claims, 6 Drawing Figures

METHOD OF PRODUCING INTEGRATED MOS CIRCUITS VIA SILICON GATE TECHNOLOGY

BACKGROUND OF THE INVENTION

1. Field of the Invention

The invention relates to integrated MOS circuits and somewhat more particularly to a method of producing high packing density of integrated MOS circuits via silicon gate technology with self-adjusting contacts by using silicon nitride masking.

2. Prior Art

In the production of highly integrated semiconductor circuits, one of the more important goals is to pack as many circuit components (for example transistors) or, respectively, functional units per surface unit based on a controllable minimum size substrate. In achieving such goals, inactive regions of IC circuits (i.e., those regions which do not directly contribute to circuit function) are particularly bothersome. Such inactive regions include the non-usable regions at the peripheries of contact holes. These inactive regions are made-up by so-called safety clearances or spacings.

Presently, the production of MOS components preferably occurs via polysilicon technology. With this technology, the gate electrodes of field effect transistors as well as conductive paths or tracks for connecting such electrodes are composed of polysilicon. An essential advantage of this technique, in comparison to a technique where such electrodes and interconnections are composed of aluminum, is that interfering gate-source and gate-drain overlap capacitors can be kept very small and that with polysilicon an additional "interconnection level" is provided.

In instances of a n-channel as well as in instances of a p-channel silicon or, respectively, double-silicon-gate technology, contact holes must be produced on the $SiO_2$ layers as well as on $n+$- or $p+$-doped monocrystalline silicon regions and on $n+$- or $p+$-doped polycrystalline silicon regions. In so doing, one must avoid having a portion of a contact hole surface projected over the region contacted because otherwise a danger exists that the metal interconnection applied over such contact hole surface may produce a short circuit to an adjacent p- or n-doped region of the monocrystalline silicon substrate. In instances where a projection of a contact hole surface extends over a polysilicon structure, besides a short circuit danger, there also exists a danger that as a result of an undercut (i.e., an underetching) of the $SiO_2$ layer beneath the polysilicon structure, an overhang of the polysilicon structure is produced, which can cause a break in the interconnection or path positioned over such overhang.

In order to prevent projections of contact holes (i.e., surfaces defining contact holes) over regions to be contacted, the so-called safety spacings are provided between the edges of a contact hole and the edges of adjacent doped silicon regions. These safety spacings are required because the spacing between two structure edges on two different structural planes cannot be arbitrarily exact but must only be within certain tolerances, which with the present state of the art is about $\pm 2$ $\mu m$.

The prior art literature suggests various proposals for reducing and/or eliminating the above-described safety clearances or spacings about peripheries of contact holes.

German Offenlegungsschrift No. 27 23 374 suggests one such process wherein, with the aid of nitride layers, by use of their oxidation-inhibiting effects as well as their etch-stop effects, contact holes are produced so that the surface area thereof projects out over the polysilicon region to be contacted. This process requires an additional contact hole mask, and on the periphery of the resultant contact holes between the monocrystalline $n+$- or $p+$-doped regions and the metal interconnections, with this process as before, safety spacings must be provided and the contact hole sidewall slopes are very steep or even overhanging.

Another process (V. L. Rideout et al, "A One-Device Memory Cell Using A Single Layer Of Polysilicon And A Self-Registering Metal-To-Polysilicon Contact", International Electron Devices Meeting, Technical Digest, Washington, D.C., December 1977, page 258) suggests covering the polysilicon layer at those locations thereof where contact holes are to be formed with a double layer, a first layer of silicon dioxide and a second layer of silicon nitride, while the remaining surface areas of the desired polysilicon structures are masked with a silicon dioxide layer. Thereafter, the non-covered portions of the polysilicon layer are etched away. This method is similarly disadvantageous as the above-referenced DT-OS No. 27 23 374, with the difference being that the sidewall slopes of the polysilicon structures (rather than that of the contact holes) can be overhanging.

Another process is suggested by W. G. Oldham et al, "Improved Integrated Circuit Contact Geometry Using Local Oxidation", Electrochemical Society, Spring Meeting, Seattle, Wash., May 1978, page 690. In this process, the oxidation-inhibiting silicon nitride layer is applied after etching of the polysilicon layer. This nitride layer is etched in such a manner that it remains only over the surface areas where the contact holes are to be formed. A disadvantage of this method is that the side slopes of the polysilicon structures can be overhanging and in instances where contact holes are positioned entirely or partially on gate regions, the safety spacings to the above-described polysilicon structure edges are required.

A method which permits a decrease of the safety spacings at peripheries of contact holes between monocrystalline $n+$-doped regions and metal interconnections or even an elimination thereof is suggested in German Offenlegungsschrift No. 25 09 315. In this method, after the contact holes are etched, doping material (such as phosphorous or arsenic) is applied into the contact holes. In this manner, a short circuit is prevented between the monocrystalline $n+$-regions and the neighboring p-doped regions in instances of projecting contact holes. The safety spacings at the periphery of the contact holes to polysilicon structures are, however, still necessary with this method, now as before.

SUMMARY OF THE INVENTION

The invention provides a method of producing high density MOS circuits via silicon gate technology with self-adjusting or self-registering contacts whereby safety spacings at peripheries of contact holes between doped regions and metal interconnections are eliminated, with no short circuits between such interconnections which can be applied over the contact holes, and the adjacent doped regions in the silicon substrate and the surface of the semiconductor circuit are relatively flat with substantially no steep steps.

In accordance with the principles of the invention, after etching contact holes for formation of contacts between doped monocrystalline regions and polysilicon regions or metal interconnections, an insulating layer is produced, after appropriate masking of the regions to be contacted via an oxidation-inhibiting silicon nitride layer, from a layer additionally applied and doped to correspond to the doped regions in the silicon substrate and which is converted via local oxidation into the insulating layer.

In accordance with certain embodiments of the invention, a doped polysilicon layer is applied and then converted by thermal oxidation into a silicon dioxide layer. Preferably, such polysilicon layer is deposited in a layer thickness of about 0.1 to 0.5 $\mu$m by thermal decomposition of a silicon-containing gaseous compound, together with an appropriate dopant substance. The invention can also be practiced with other material in place of polysilicon as long as such other material can be converted by local oxidation into an insulating layer. For example, aluminum is one such material since it can be vapor deposited and then converted by anodic oxidation into insulating aluminum oxide. This embodiment of the invention is useful in producing IC circuits having several metal interconnection levels for producing an insulating layer and contacts between two metal interconnection levels.

An exemplary embodiment of the invention for producing integrated n- or p-channel MOS circuits comprises the following combination of sequential steps:

(a) producing structured $SiO_2$ layers on a p- or n-doped semiconductor substrate for separating active transistor regions in accordance with the so-called LOCOS or isoplanar technique;

(b) oxidizing free n- or p-doped substrate surface regions to attain gate oxidation;

(c) depositing a $n^+$- or $p^+$-doped polysilicon layer on the entire surface of the structure;

(c) depositing a silicon nitride layer on the entire surface of the structure;

(e) etching the silicon nitride and the polysilicon layer so as to produce nitride-coated polysilicon regions;

(f) producing monocrystalline $n^+$- or $p^+$-doped source and drain regions in the p- or n-doped silicon substrate via ion implantation;

(g) producing a $SiO_2$ layer over the monocrystalline $n^+$- or $p^+$-doped regions by thermal oxidation;

(h) removing the nitride mask:

(i) etching contact holes for formation of contacts between monocrystalline $n^+$- or $p^+$-doped regions and polysilicon regions (buried contacts) or metal interconnections;

(j) depositing a $n^+$- or $p^+$-doped polysilicon layer on the entire surface of the structure;

(k) depositing a silicon nitride layer on the entire surface of the structure;

(l) etching the silicon nitride layer except for those locations where contacts are provided to the metallic tracks;

(m) converting the uncovered polysilicon layer into a $SiO_2$ layer by thermal oxidation;

(n) removing the nitride mask; and (o) producing a desired metal interconnection pattern.

In comparison to known silicon gate processes, steps (d), (e) and (h) through (m) are different. Described in an analogous manner as the silicon gate process, a double silicon gate process (double polysilicon-gate process) can also be applied to the inventive process. In such case, step (d) and the following steps occur after deposition of the second polysilicon layer.

The primary advantages of the invention, in relation to known methods, are:

(1) In instances of equal polysilicon thickness and equal oxide thickness over the polysilicon regions, the step height at the polysilicon sides is lower.

(2) The curve or path of the side slopes at the $SiO_2$-covered polysilicon sides is more favorable with respect to covering of the edges by metal interconnections because no steep or negative side angles occur.

(3) Relatively thick $SiO_2$-layers (approximately 1 $\mu$m) can be produced over the polysilicon.

(4) The $SiO_2$-thickness between metal interconnections and the monocrystalline $n^+$-doped regions is greater.

(5) During etching of the nitride layer (method step 1), the nitride can be left not only at the contact locations but also at all other areas where connecting polysilicon interconnections are to be produced. In this manner, an additional "wiring plane" is attained. The polysilicon interconnections of such wiring planes can cross over underlying polysilicon interconnections as well as monocrystalline $n^+$- or $p^+$-doped regions. However, such polysilicon interconnections cannot be crossed over by metal interconnections. The latter would only be possible if an insulating layer were applied over the polysilicon interconnections, as a further extension of the inventive process. To accomplish this, one could, for example, proceed in accordance with process steps (j) through (n).

DESCRIPTION OF THE PREFERRED EMBODIMENTS

Figure 1:
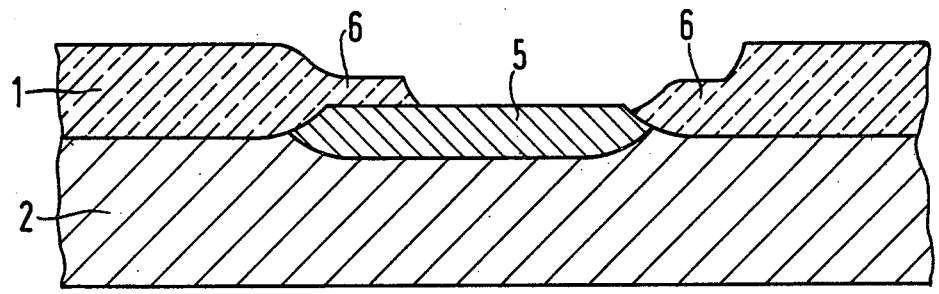
FIG. 1 is an elevated, somewhat schematic, cross-sectional partial view of a semiconductor circuit being produced in accordance with the principles of the invention, illustrating a contact track for a monocrystalline $n^+$-doped region.

For purposes of promoting an understanding of the principles of the invention, reference now will be made to the embodiments illustrated in the drawings and specific language will be used to describe the same. It will nevertheless be understood that no limitation of the scope and spirit of the invention is thereby intended, such alterations and further modifications in the illustrated device, and such further applications of the principles of the invention as illustrated therein being contemplated as would normally occur to one skilled in the art to which the invention relates.

Figure 2:
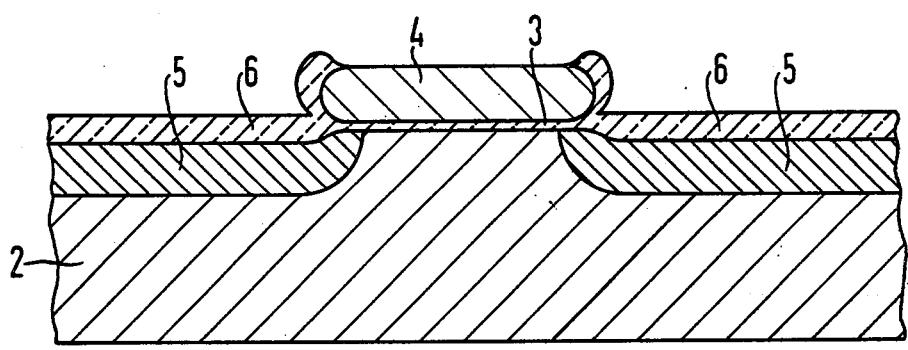
FIG. 2 is a somewhat similar view illustrating a contact interconnection to a polysilicon region.
Figure 3:
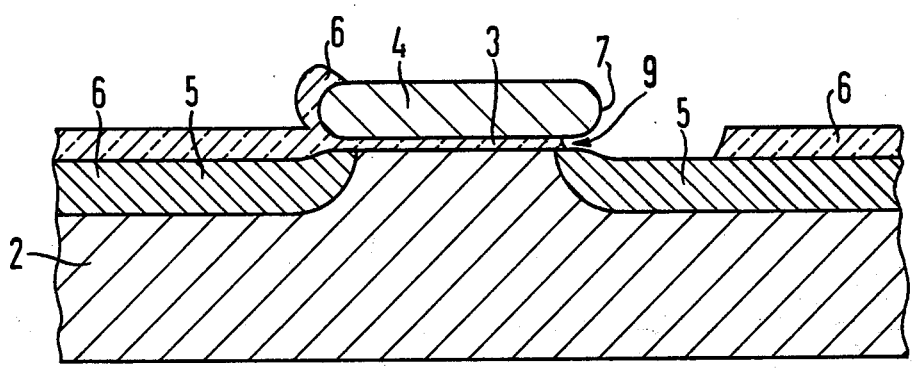
FIG. 3 is also a somewhat similar view illustrating a contact polysilicon interconnection to a monocrystalline $n^+$-doped region.
Figure 4:
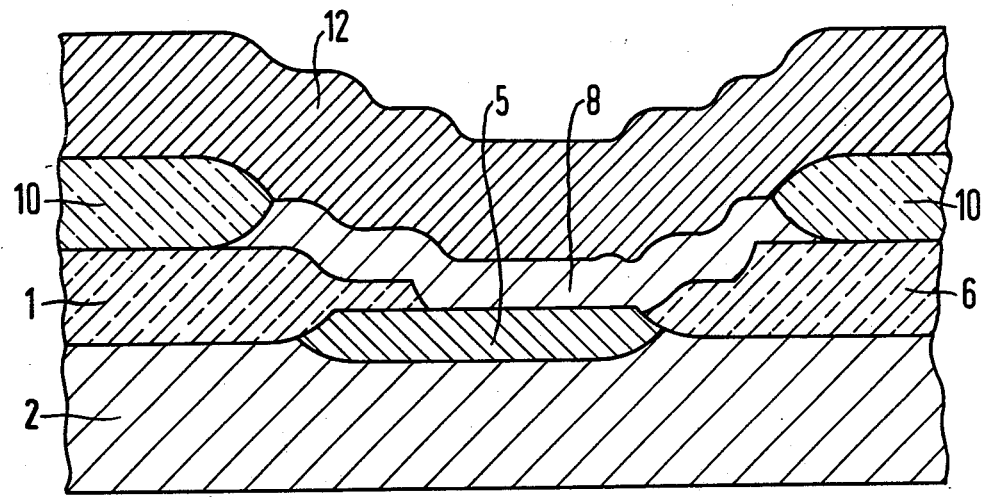
FIGS. 4–6 illustrate the different contact regions of FIGS. 1–3 at the end of the production process, with FIG. 4 corresponding to FIG. 1, FIG. 5 corresponding to FIG. 2 and FIG. 6 corresponding to FIG. 3.
Figure 5:
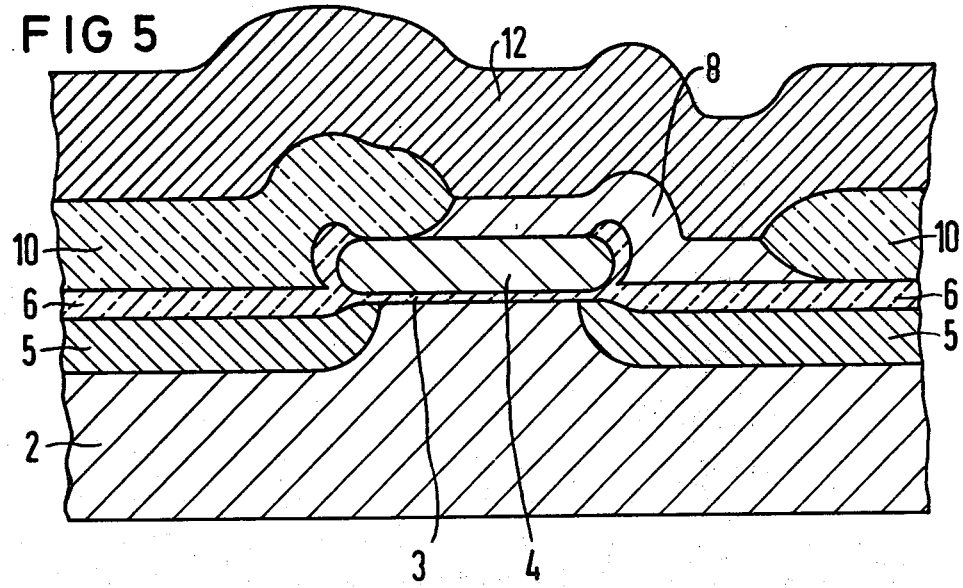
Figure 6:
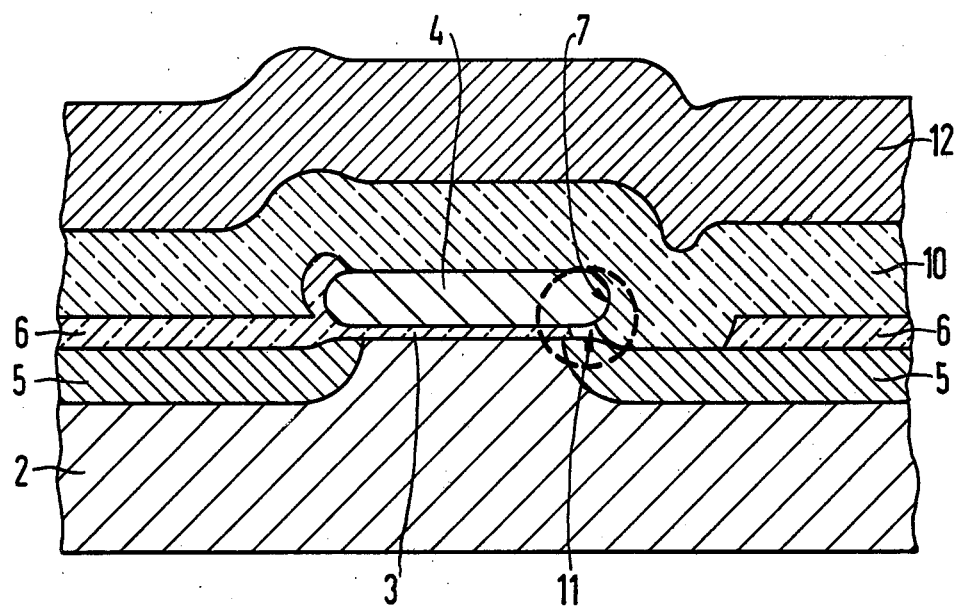

In the drawings, an exemplary process embodiment useful with, for example a silicon-gate process in n-channel MOS-technology, is set forth. In proceeding in accordance with this technology and the principles of the invention, the following sequential combination of steps occur:

(a) Producing structured SiO$_2$-layers 1 (so-called field-oxide regions, approximately 0.6 μm in thickness) upon a p-doped semiconductor substrate 2 in order to separate active transistor regions in accordance with the so-called LOCOS or isoplanar technique (FIG. 1);

(b) oxidizing the free substrate surfaces to a layer thickness of about 0.06 μm so as to attain gate oxidation (SiO$_2$ layer 3 in FIG. 2). At this stage, if desired, implantation of p- or n-dopant materials can occur in the channel regions of the transistors;

(c) depositing an approximately 0.4 μm thick n$^+$-doped polysilicon layer 4 on the entire structure surface via a gas-phase deposition process (i.e., a so-called chemical vapor deposition or CVD-process) (FIG. 2);

(d) depositing via the CVD-process an approximately 0.1 μm thick silicon nitride layer on the entire structure surface. Preferably the silicon nitride layer is deposited by a chemical reaction of gaseous silicon- or nitride-containing compound, such as SiH$_4$ or NH$_3$;

(e) etching the silicon nitride layer and the polysilicon layer so as to produce nitride-covered polysilicon regions;

(f) ion implanting a dopant (arsenic or phosphorous) so as to produce monocrystalline n$^+$-doped source regions and drain regions 5 (FIG. 1);

(g) producing an approximately 0.2 μm thick SiO$_2$ layer over the monocrystalline n$^+$-doped regions 5 by thermal oxidation. Oxidation of the polysilicon regions 4 is prevented (except for the side slope regions) by the silicon nitride layer which covers the polysilicon 4 (FIG. 2);

(h) removing the nitride masking;

(i) etching contact holes for the formation of contacts between monocrystalline n$^+$-doped regions 5 on the one side and polysilicon regions 4 (the so-called buried contacts), or metal interconnections 12 on the other side. During this step, in the region of the buried contacts, overhanging polysilicon edges 7 are formed (FIG. 3), assuming an isotropic etching attack;

(j) CVD-depositing a n$^+$-doped polysilicon layer 8, having a thickness in the range of about 0.1 to 0.5 μm. During this step, the "hollows" 9 under the overhanging polysilicon edges 7 (FIG. 3) are filled with polysilicon;

(k) CVD-depositing a silicon nitride layer having a thickness of about 0.1 μm on the entire structure surface;

(l) etching the nitride layer except for those locations where contacts are to be formed to the metal interconnections 12;

(m) converting the polysilicon layer 8, which was deposited last, into a SiO$_2$-layer 10 via thermal oxidation. The portions of the polysilicon layer 4 which are covered with nitride remain unchanged. As soon as the polysilicon layer is converted in its full thickness into SiO$_2$, the thermal oxidation is ended and in the region of the buried contacts, a polysilicon bridge 11 remains (shown by dotted circle at FIG. 6) between the monocrystalline n$^+$-doped regions 5 and the projecting edges 7 of the polysilicon regions 4. This bridge 11 is a new type of buried contact and can be clearly seen in FIG. 6;

(n) removing the nitride masking; and (o) producing desired metal interconnection patterns 12.

It is thought that the invention and its advantages will be understood by those skilled in the art from the foregoing description and it is apparent that various changes may be made in the process, form, construction and arrangement of circuit parts without departing from the spirit and scope of the invention or sacrificing its advantages. The forms hereinbefore described and illustrated being merely preferred embodiments.

I claim as my invention:

1. A method of producing integrated n- or p-channel MOS circuits in silicon gate technology with self-adjusting contacts, comprising the steps:

(a) producing structure SiO$_2$ layers (1) on a p- or n-doped semiconductor substrate (2) for separation of active transistor regions according to the so-called LOCOS or isoplanar technique;

(b) oxidizing the free p- or n-substrate surfaces so as to attain gate oxidation;

(c) depositing a n$^+$- or p$^+$-doped polysilicon layer (4) over the entire structure surface;

(d) depositing a silicon nitride layer over the entire structure surface;

(e) etching the silicon nitride and the polysilicon layers so as to produce nitride-coated polysilicon regions;

(f) producing monocrystalline n$^+$- or p$^+$-doped source and drain regions (5) in the p- or n-doped substrate (2) by ion implantation;

(g) producing a SiO$_2$ layer (6) over the monocrystalline n$^+$- or p$^+$-doped regions (5) by thermal oxidation whereby the oxidation of the polysilicon regions (4) is prevented by the silicon nitride layer positioned over the polysilicon regions (4) and an oxide layer is produced only on the slope surfaces;

(h) removing the nitride masking;

(i) etching contact holes for formation of contacts between monocrystalline n$^+$- or p$^+$-doped regions (5) and polysilicon regions (4) and/or metal interconnections (12), whereby in the region of buried contacts (9), because of an isotropic etching attack, overhanging polysilicon edges (7) are formed;

(j) depositing a n$^+$- or p$^+$-doped polysilicon layer (8) on the entire structure surface whereby the regions (9) beneath the overhanging polysilicon edges (7) are filled with polysilicon (8);

(k) depositing a layer of silicon nitride on the entire structure surface;

(l) etching the silicon nitride layer except at those locations at which contacts to the metal interconnections (12) are provided;

(m) converting the uncovered polysilicon layer (8) into a SiO$_2$ layer by thermal oxidation, whereby the portions of the polysilicon layer (4) covered with nitride remain unchanged, and, in the region of the buried contacts (9), a polysilicon contact bridge (11) is formed between the monocrystalline n$^+$- or p$^+$-doped regions (5) and the overhanging edges (7) of the polysilicon region (4);

(n) removing the nitride masking; and (o) producing a desired metal interconnection pattern (12).

2. In a method as defined in claim 1 wherein said additionally applied layer (8) is applied in a thickness in the range of about 0.1 to 0.5 μm.

3. In a method as defined in claim 1 wherein the silicon nitride layer used for masking is produced in a layer thickness of about 0.1 μm by chemical reaction of gaseous silicon- or nitrogen-containing compounds.

4. A method as defined in claim 1 wherein said process occurs during a double polysilicon-gate process and steps (d) through (o) occur after deposition of a second polysilicon layer.

* * * * *